(12) United States Patent
Chin et al.

(10) Patent No.: US 7,638,375 B2
(45) Date of Patent: Dec. 29, 2009

(54) METHOD OF MANUFACTURING THIN FILM TRANSISTOR SUBSTRATE

(75) Inventors: Hong-Kee Chin, Suwon-si (KR);
Yu-Gwang Jeong, Yongin-si (KR);
Sang-Gab Kim, Seoul (KR); Joo-Han Kim, Yongin-si (KR); Joo-Ae Youn, Swongnam-si (KR); Min-Seok Oh, Yongin-si (KR); Jong-Hyun Choung, Hwaseong-si (KR); Seung-Ha Choi, Siheung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/009,253

(22) Filed: Jan. 16, 2008

(65) Prior Publication Data
US 2008/0268581 A1  Oct. 30, 2008

(30) Foreign Application Priority Data
Apr. 27, 2007  (KR) ............... 10-2007-0041378

(51) Int. Cl.
*H01L 21/84*  (2006.01)
(52) U.S. Cl. .............. 438/158; 257/E21.414; 438/151

(58) Field of Classification Search ............. 438/149, 438/151, 30, 158; 257/E21.414
See application file for complete search history.

(56) References Cited

U.S. PATENT DOCUMENTS

| 7,098,062 B2* | 8/2006 | Shih ......................... 438/30 |
| 7,410,817 B2* | 8/2008 | Oh et al. ..................... 438/30 |
| 2005/0077517 A1* | 4/2005 | Chang et al. .................. 257/59 |

* cited by examiner

*Primary Examiner*—Matthew C Landau
*Assistant Examiner*—Jessica Hall
(74) *Attorney, Agent, or Firm*—Innovation Counsel LLP

(57) ABSTRACT

A method of manufacturing a TFT substrate includes: sequentially forming a transparent conductive layer and an opaque conductive layer on a substrate, patterning the transparent conductive layer and the opaque conductive layer by using a first mask to form a gate pattern including a pixel electrode, and forming a gate insulating layer and a semiconductor layer above the substrate. A contact hole is formed which exposes a portion of the pixel electrode and a semiconductor pattern using a second mask. A conductive layer is formed above the substrate and patterned to form a source/drain pattern including a drain electrode which overlaps a portion of the pixel electrode. Portions of the gate insulating layer and the opaque conductive layer above the pixel electrode are removed except a portion overlapping the drain electrode, by using a third mask.

11 Claims, 12 Drawing Sheets

METHOD OF MANUFACTURING THIN FILM TRANSISTOR SUBSTRATE

CROSS-REFERENCE TO RELATED APPLICATION

This application claims priority from and the benefit of Korean Patent Application No. 10-2007-0041378, filed on Apr. 27, 2007 in the Korean Intellectual Property Office, the disclosure of which is incorporated herein by reference in its entirety.

BACKGROUND OF THE INVENTION

1. Field of the Invention

The present invention relates to a method of manufacturing a thin film transistor ("TFT") substrate with excellent characteristics by using a three-mask process.

2. Description of the Related Art

An active matrix display device such as a liquid crystal display ("LCD") device or an organic light emitting display ("OLED") device includes a plurality of pixels which are arranged in a matrix form. Each of the pixels includes an electric field generating electrode and a switching element.

As a switching element, a TFT which is a three-terminal element including a gate, a source and a drain is usually used. The TFT transmits a data signal applied to the source to an electric field generating electrode in response to a gate signal applied to the gate electrode.

Such a display device further includes gate lines and data lines which transmit signals to the TFTs. The display device includes a TFT substrate on which the electric field generating electrode, the TFTs, the gate lines, and the data lines are formed.

The TFT substrate has a multi-layer structure in which a plurality of conductive layers and a plurality of insulating layers are stacked. The TFT substrate with the multi-layer structure is manufactured using several photolithographic processes and subsequent etching processes.

A photolithographic process includes complicated steps such as a deposition process, a cleaning process, a photoresist coating process, a light exposure process, a developing process, an etching process, and a photoresist strip process, and thus a defect may occur in the TFT substrate during the photolithographic process. Accordingly it is desirable to reduce the number of photolithographic processes employed.

SUMMARY OF THE INVENTION

An exemplary embodiment of the present invention provides a method of manufacturing a TFT substrate in which the TFT substrate is manufactured through three mask processes and a relatively thin photoresist is used during each mask process.

In an exemplary embodiment of the present invention, a method of manufacturing a thin film transistor substrate includes: sequentially forming a transparent conductive layer and an opaque conductive layer on a substrate; patterning the transparent conductive layer and the opaque conductive layer by using a first mask to form a gate pattern including a pixel electrode; forming a gate insulating layer and a semiconductor layer above the substrate; forming a contact hole which exposes a portion of the pixel electrode and a semiconductor pattern by using a second mask; forming a conductive layer above the substrate; and patterning the conductive layer to form a source and drain pattern including a drain electrode which overlaps a portion of the pixel electrode and removing portions of the gate insulating layer and the opaque conductive layer above the pixel electrode except a portion overlapping the drain electrode, by using a third mask.

The transparent conductive layer is made of indium tin oxide (ITO), indium zinc oxide (IZO), tin oxide (TO), or indium tin zinc oxide (ITZO).

The step of sequentially forming the transparent conductive layer and the opaque conductive layer includes: forming a lower layer made of a refractory metal which comprises molybdenum, chromium, tantalum, or titanium or of an alloy thereof on the transparent conductive layer; forming a middle layer made of a metal having a low specific resistance which comprises at least one of an aluminum-based metal, a silver-based metal, and a copper-based metal on the lower layer; and forming an upper layer made of a refractory metal which comprises molybdenum, chromium, tantalum, or titanium or of an alloy thereof.

The second mask is a slit mask.

The step of forming the contact hole and the semiconductor pattern using the second mask includes: forming a first photoresist pattern which exposes a region where the contact hole is to be formed on the semiconductor layer; forming the contact hole using the first photoresist pattern; modifying the first photoresist pattern to form a second photoresist pattern which exposes a region except a region where the semiconductor pattern is to be formed; etching the semiconductor layer by using the second photoresist pattern to form the semiconductor pattern; and removing the second photoresist pattern.

The first photoresist pattern includes: an opening portion which exposes the region where the contact hole is to be formed; a thick layer portion formed at a first thickness in the region where the semiconductor pattern is to be formed; and a thin layer portion formed at a second thickness which is thinner than the first thickness in the remaining region except the regions corresponding to the opening portion and the thick layer portion.

The first thickness is about 1.5 μm to 2.5 μm or less.

The second thickness of about 3,000 to 4,000 . The semiconductor pattern has an area smaller than an area of the gate electrode.

The conductive layer is made of a refractory metal which comprises molybdenum, chromium, tantalum, or titanium or of an alloy thereof.

The second mask is a slit mask.

The step of forming the source/drain pattern and removing the gate insulating layer and the opaque conductive layer above the pixel electrode by using the third mask includes: forming a third photoresist pattern which exposes the remaining region except a portion of the pixel electrode corresponding to the contact hole on the conductive layer; removing portions of the conductive layer and the gate insulating layer except the portion of the pixel electrode corresponding to the contact hole by using the third photoresist pattern; modifying the third photoresist pattern to form a fourth photoresist pattern which exposes a channel region between the source and drain electrodes; removing a portion of the conductive layer corresponding to the channel region and a portion of the opaque conductive layer above the pixel electrode except a portion overlapping the conductive layer by using the fourth photoresist pattern; and removing the fourth photoresist pattern.

The step of forming the source/drain pattern and removing the gate insulating layer and the opaque conductive layer above the pixel electrode by using the third mask includes: forming a third photoresist pattern which exposes the remaining region except a portion of the pixel electrode corresponding to the contact hole on the conductive layer; removing portions of the conductive layer, the gate insulating layer and the opaque conductive layer above the portion of the pixel electrode except portions corresponding to the contact hole by using the third photoresist pattern; modifying the third photoresist pattern to form a fourth photoresist pattern which exposes a channel region between the source and drain electrodes; removing a portion of the conductive layer corresponding to the channel region by using the fourth photoresist pattern; and removing the fourth photoresist pattern.

BRIEF DESCRIPTION OF THE DRAWINGS

The above and other features of the present invention will be described in reference to certain exemplary embodiments thereof with reference to the attached drawings in which.

DETAILED DESCRIPTION OF EXEMPLARY EMBODIMENTS

Figure 1:
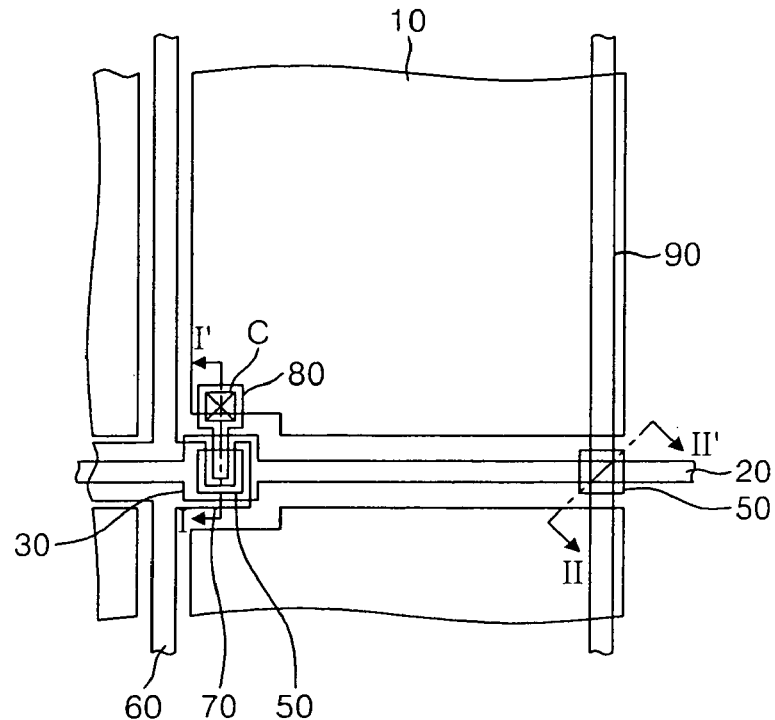
FIG. 1 is a plan view illustrating a TFT substrate according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. Like reference numerals refer to similar or identical elements throughout the description of the figures.

Figure 2:
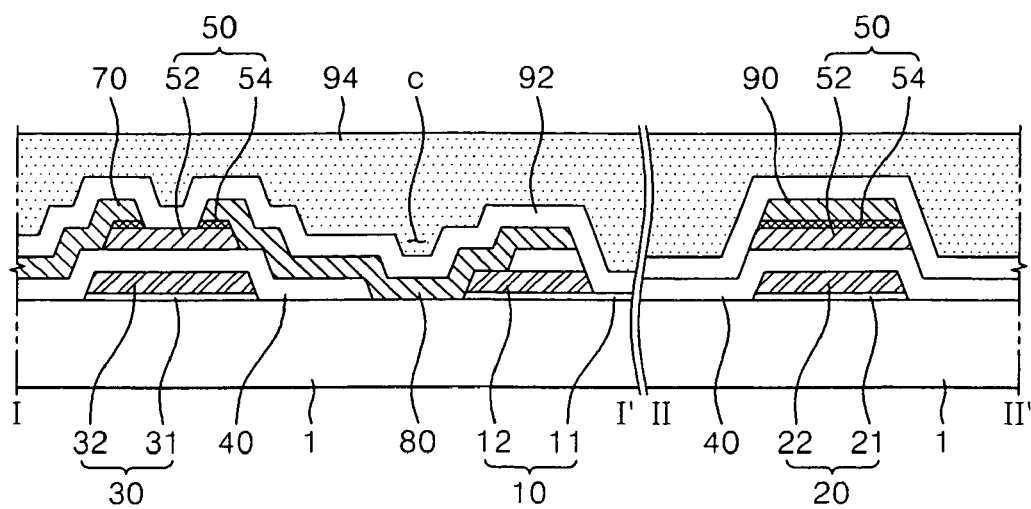
FIG. 2 is a cross-sectional view taken along lines I-I' and II-II' of FIG. 1.

A TFT substrate according to an exemplary embodiment of the present invention is described in detail with reference to FIG. 1. FIG. 1 is a plan view illustrating the TFT substrate according to the exemplary embodiment of the present invention, and FIG. 2 are cross-sectional views taken along lines I-I' and II-II' of FIG. 1.

As shown in FIG. 1, the TFT substrate of the present invention includes a pixel electrode 10, a gate line 20, a gate electrode 30, a gate insulating layer 40, a semiconductor pattern 50, a data line 60, a source electrode 70, a drain electrode 80, and a storage line 90.

The pixel electrode 10 is formed of a transparent conductive layer on a substrate 1. The substrate 1 is made of transparent glass or plastic. The pixel electrode 10, as shown in FIG. 1, is formed on a pixel region of a rectangular shape formed by the gate line 20 and the data line 60 and thus has a rectangular shape.

The transparent conductive layer which is used to form the pixel electrode 10 may be made of indium tin oxide ("ITO") which is a transparent conductive material having a good profile during an etching process. Alternatively, the transparent conductive layer may be made of a transparent conductive material such as indium zinc oxide ("IZO"), tin oxide ("TO"), or indium tin zinc oxide ("ITZO") or of a reflective metal such as aluminum ("Al"), chromium ("Cr"), or an alloy thereof. The pixel electrode 10 may be formed such that an opaque conductive layer 12 is formed on the transparent conductive layer 11. The opaque conductive layer 12 is made of the same material as an opaque conductive layer 22 of the gate line 20.

The gate line 20 is arranged in a transverse direction to transmit a scan signal. The gate line 20 includes a transparent conductive line 21 formed on the substrate 1 and the opaque conductive layer 22 which is formed directly on the transparent conductive layer 21. The transparent conductive layer 21 is made of the substantially same material as the transparent conductive layer 11 which forms the pixel electrode 10. The transparent conductive layer 11 of the pixel electrode 10 and the transparent conductive layer 21 of the gate line 21 are formed by patterning the same transparent conductive material layer.

Figure 2A:
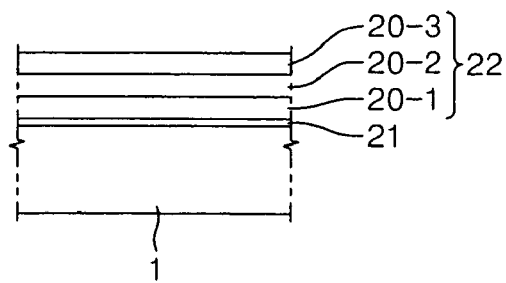
FIG. 2A is a detailed view of an embodiment of gate line 20 shown in FIG. 2.

The opaque conductive layer 22 of the gate line 20, as shown in FIG. 2, is formed directly on the transparent conductive layer 21. As shown in FIG. 2A, the opaque conductive layer 22 is a triple-layer structure having a lower layer 20-1, a middle layer 20-2, and an upper layer 20-3. Lower layer 20-1 is made of a refractory metal which has an excellent contact characteristic with, which may be, for example, an amorphous ITO or an alloy thereof. Middle layer 20-2 may be made of any of an aluminum-based metal, a silver-based metal and a copper-based metal which have a low specific resistance. Upper layer 20-3 is a refractory metal such as molybdenum ("Mo"), chromium ("Cr"), tantalum ("Ta"), or titanium ("Ti") or of an alloy thereof. For example, the triple-layer opaque conductive layer 22 may be formed such that the lower layer is a layer of Mo (or Mo alloy), the middle layer is a layer of Al (or Al alloy), and the upper layer is a layer of Mo (or Mo alloy).

Figure 2B:
FIG. 2B is a detailed view of an embodiment of opaque conductive layer 22.

As shown in FIG. 2B, the opaque conductive layer 22 may have a dual-layer structure which includes lower layer 20-4 of a refractory metal and the upper layer 20-5 of a low resistance metal layer, but it may have a single-layer structure made of any of the above-described materials. For example, a dual-layer gate line 20 may include lower layer 20-4 of Cr (or Cr alloy) or Mo (or Mo alloy) and upper layer 20-5 of Al (or Al alloy).

The gate electrode 30 contacts the gate line 20 to transmit a scan signal to the TFT. As shown in FIG. 1, the gate electrode 30 is formed such that it extends from the gate line 20. That is, the gate electrode 30 is formed together with the gate line 20 and has the same cross-sectional structure as the gate line 20. Thus, a description of a cross-sectional structure of the gate electrode 30 is omitted.

The gate insulating layer 40 is formed to cover the gate line 20 and the gate electrode 30, electrically insulating them from other layers. The gate insulating layer 40 is made of silicon nitride ("SiNx") or silicon oxide ("SiOx"). The gate insulating layer 40 does not overlap the pixel electrode 10 but covers only the gate line 20 and the gate electrode 30 in order to increase an aperture ratio of the pixel.

As shown in FIG. 1, storage line 90 overlaps the pixel electrode 10, and the gate insulating layer 40 is formed to overlap the pixel electrode 10. In particular, since a contact hole C is formed in a region where the drain electrode 80 and the pixel electrode 10 contact, the gate insulating layer 40 does not exist in that region. Therefore, a contact characteristic between the drain electrode 80 and the pixel electrode 10 is very excellent, which is described below. The portion of the gate insulating layer 40 which overlaps the pixel electrode 10 is arranged between the storage line 90 and the pixel electrode 10 to form a storage capacitor.

The semiconductor pattern 50 is formed on the gate insulating layer 40 to overlap the gate electrode 30. The semiconductor pattern 50 forms a channel between a source electrode 70 and a drain electrode 80. In this exemplary embodiment, the semiconductor pattern 50 is formed to have approximately the same width as gate electrode 30. That is, it is to make the semiconductor pattern 50 have an area smaller than that of the gate electrode 30.

If the semiconductor pattern 50 were to have a width greater than that of gate electrode 30, a leakage current would occur when the TFT substrate is employed in the LCD device. That is, a photoelectric current is generated in the exposed portion of the semiconductor pattern 50 due to light irradiated from a backlight unit of the LCD device, so that characteristics of the TFT are degraded, leading to display inferiority. However, as described above, since the semiconductor pattern 50 is arranged in an area of the gate electrode 30, light irradiated from the backlight unit is shielded by the gate electrode 30 having a transparent conductive layer 31 and an opaque conductive layer 32. Therefore, light is not irradiated to the semiconductor pattern 50, and a leakage current does not occur, whereby characteristics of the TFT are excellent.

The semiconductor pattern 50 includes a semiconductor layer 52 and an ohmic contact layer 54 which is formed directly on the semiconductor layer 52. The semiconductor layer 52 may be made of hydrogenated amorphous silicon or polycrystalline silicon. The ohmic contact layer 54 may be made of n+ hydrogenated amorphous silicon into which an n-type impurity is doped at a high density or of silicide. The ohmic contact layer 54 is arranged on the semiconductor layer 52 as a pair to reduce a work function difference between the semiconductor layer 52 and a source electrode 70 and between the semiconductor layer 52 and a drain electrode 80.

As shown in FIGS. 1 and 2, the semiconductor pattern 50 is further formed in an island form in a region where the gate line 20 and the storage line 90 overlap. The semiconductor pattern 50 is arranged between the gate line 20 and the storage line 90 and serves to insulate the gate line 20 so that a common voltage passing through the storage line 90 and a scan signal passing through the gate line 20 do not interfere with each other. For this reason, as shown in FIG. 2, the semiconductor pattern 50 is formed at the wider width than the gate line 20 to completely insulate the gate line 20.

The data line 60 transfers a pixel signal and is arranged in a vertical direction to cross the gate line 20 as shown in FIG. 1. Pixel regions of a rectangular form are formed by the gate lines 20 and data lines 60 which cross each other.

The drain electrode 80 is separated from the data line 60 and faces the source electrode 70 centering on the gate electrode 30. The drain electrode 80 is formed in an elongated form as shown in FIG. 1. The source electrode 70 is electrically connected to the data line 60 and has a bent shape, e.g., a letter "C" shape as shown in FIG. 1. One end of the drain electrode 80 is surrounded by the C-shaped source electrode 70 and the other end thereof overlaps the pixel electrode 10. A contact hole C is formed in a region where the drain electrode 80 and the pixel electrode 10 overlap, exposing a portion of the pixel electrode 10. The drain electrode 80 is electrically connected to the pixel electrode 10 via the contact hole C.

The source electrode 70 transfers the pixel signal to the drain electrode 80 through a channel formed by the semiconductor layer 50 when the scan signal is applied to the gate electrode 30. The drain electrode 80 transfers the pixel signal to the pixel electrode 10.

As described above, a portion of the drain electrode 80 electrically contacts the pixel electrode 10, and in this embodiment, the drain electrode 80 directly contacts the pixel electrode 10 without intervention of the gate insulating layer 40. In detail, the drain electrode 80 and the pixel electrode 10 contact each other through the opaque conductive layer 12 interposed therebetween.

A storage line 90 may be further arranged on the TFT substrate. The storage line 90 partially overlaps the pixel electrode 10, insulated by the gate insulating layer 40 and is arranged in parallel to the data line 60, as shown in FIG. 1.

The storage line 90 constitutes the storage capacitor together with the pixel electrode 10 and the gate insulating layer 40 to stably maintain a pixel voltage applied to the pixel electrode 10. The aperture ratio becomes lower as the region where the storage line 90 and the pixel electrode 10 overlap is wider, and the capacitor's capacitance becomes smaller as the region where the storage line 90 and the pixel electrode 10 overlap is narrower. Therefore, the width of the storage line 90 should be appropriately determined. It is preferable to form the width of the storage line as small as possible in order to obtain the higher aperture ratio.

Figure 2C:
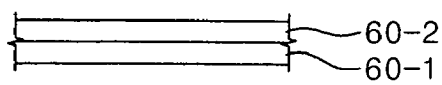
FIG. 2C is a cross section of an embodiment of a data line, a source electrode, a drain electrode and a storage line.
Figure 2D:
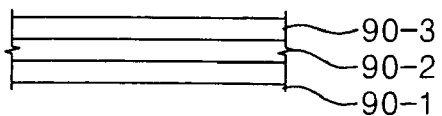
FIG. 2D is a cross-section of an embodiment of a data line, a source electrode, a drain electrode and a storage line.

In this exemplary embodiment, the data line 60, the source electrode 70, the drain electrode 80, and the storage line 90 are made of the same material. The data line 60, the source electrode 70, the drain electrode 80, and the storage line 90 are made of a refractory material such as Mo, Cr, Ta, or Ti, or an alloy thereof. As shown in FIG. 2C, the data line 60, as well as the source electrode 70, the drain electrode 80, and the storage line 90 may have a multi-layer structure including a refractory metal layer and a low resistant conductive layer. For example, the data line 60, the source electrode 70, the drain electrode 80, and the storage line 90 include a lower layer 60-1 made of Cr (Cr alloy) or Mo (or Mo alloy) and an upper layer 60-2 made of Al (Al alloy). Alternatively, the data line 60, the source electrode 70, the drain electrode 80, and storage line 90 include a lower layer 90-1 made of Mo (or Mo alloy), a middle layer 90-2 made of Al (or Al alloy), and an upper layer 90-3 made of Mo (or Mo alloy).

A passivation film 92 is formed over the whole surface of the substrate 1 to cover the data line 60, the drain electrode 80, the exposed semiconductor layer 52, and the gate insulating layer 40. The passivation film 92 is made of an inorganic insulating material such as SiNx and SiOx or of an organic insulating material. The organic insulating material may have photosensitivity and preferably has a dielectric constant of about 4.0 or less. The passivation film 92 may a dual-layer structure including a lower inorganic layer and an upper organic layer not to damage the exposed semiconductor layer while maintaining an excellent insulating characteristic of the organic layer.

An organic insulating layer 94 is formed on the passivation film 92. The organic insulating layer 94 may be planarized if the passivation film 92 is made of an inorganic insulating material.

Hereinafter, a method of manufacturing the TFT substrate according to the exemplary embodiment of the present invention is described with reference to FIGS. 3A to 8.

Figure 3A:
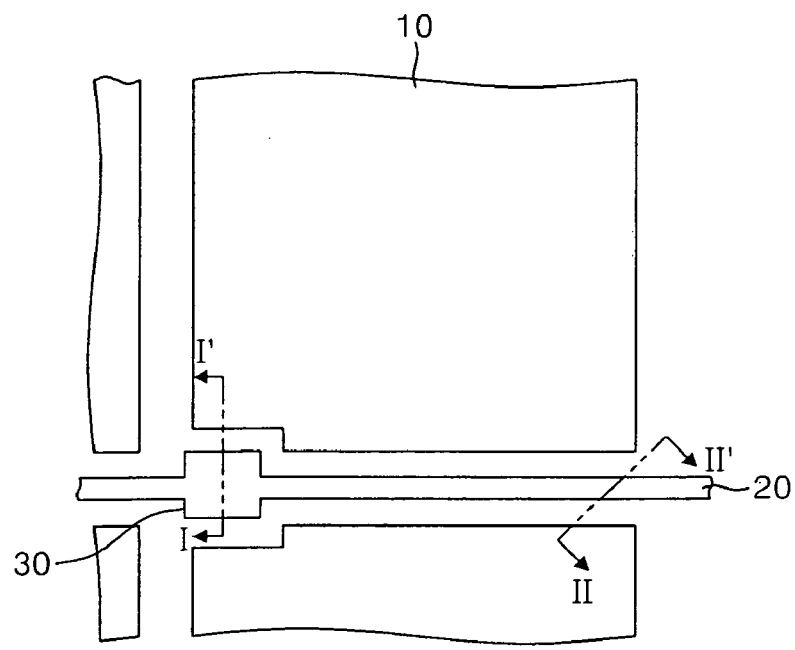
FIGS. 3A and 3B are respectively a plan view and a cross-sectional view taken along lines I-I' and II-II' of FIG. 3A illustrating a first mask process for manufacturing the TFT substrate according to the exemplary embodiment of the present invention.
Figure 3B:
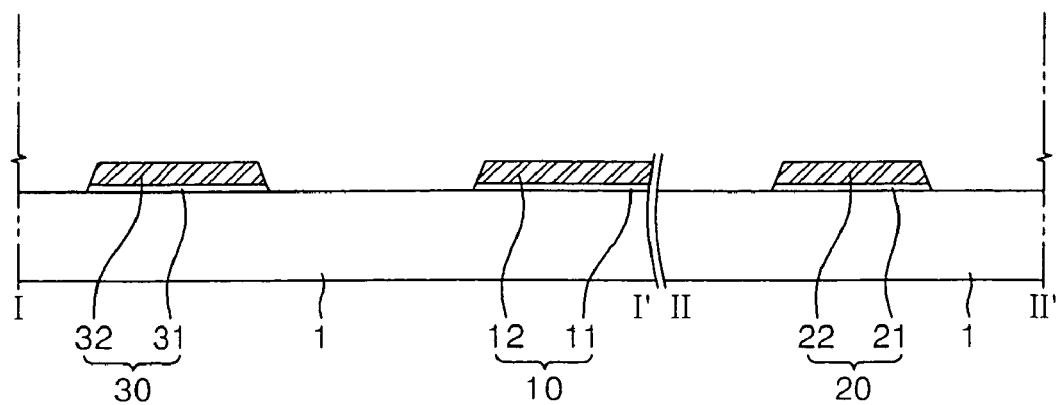

FIG. 3A is a plan view illustrating a first mask process for manufacturing the TFT substrate according to the exemplary embodiment of the present invention, and FIG. 3B is a cross-sectional view taken along lines I-I' and II-II' of FIG. 3A. As shown in FIGS. 3A and 3B, a transparent conductive material layer such as amorphous ITO is deposited on an insulating substrate 1 made of transparent glass by using the sputtering technique. Then, an opaque conductive material layer including a lower Mo layer, a middle Al layer and an upper Mo layer are sequentially deposited on the transparent conductive material layer by using the sputtering technique. In this state, a photoresist layer is coated on the opaque conductive material layer at the thickness of about 1 μm or less. A first mask is aligned above the substrate 1, and the photoresist layer is subjected to light exposure by using the first mask. Here, the first mask includes a shielding portion corresponding to regions where the pixel electrode 10, the gate line 20 and the gate electrode 30 are to be formed and a transmitting portion corresponding to the other regions. Preferably, the first mask is not a slit mask but a regular mask, whereby the mask process is simple.

The light-exposed photoresist layer is developed to obtain a photoresist pattern. An etching process is performed by using the photoresist pattern as an etching mask, so that portions of the transparent conductive material layer and the opaque conductive material layer except portions covered by the photoresist pattern are removed, thereby forming the transparent conductive layer and the opaque conductive layer.

Figure 4A:
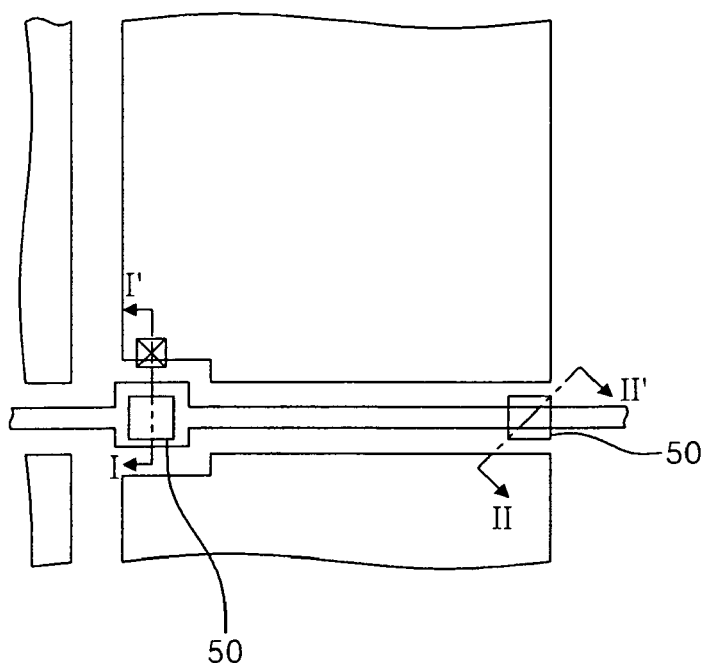
FIGS. 4A and 4B are respectively a plan view and a cross-sectional view taken along lines I-I' and II-II' of FIG. 4A illustrating a second mask process for manufacturing the TFT substrate according to the exemplary embodiment of the present invention.

Here, the transparent conductive layer and the opaque conductive layer may be formed by removing the portions of the transparent conductive material layer and the opaque conductive material through a single etching process which uses an etchant or through twice etching processes. Thereafter, the photoresist pattern is removed by the strip process, so that a gate pattern including the gate line 20, the gate electrode 30 and the pixel electrode 10 is obtained, as shown in FIG. 3B. Here, each of the gate line 20, the gate electrode 30 and the pixel electrode 10 includes the transparent conductive layer and the opaque conductive layer. FIG. 4A is a plan view illustrating a second mask process for manufacturing the TFT substrate according to the exemplary embodiment of the present invention, and FIG. 4B is a cross-sectional view taken along lines I-I' and II-II' of FIG. 4A.

Figure 4B:
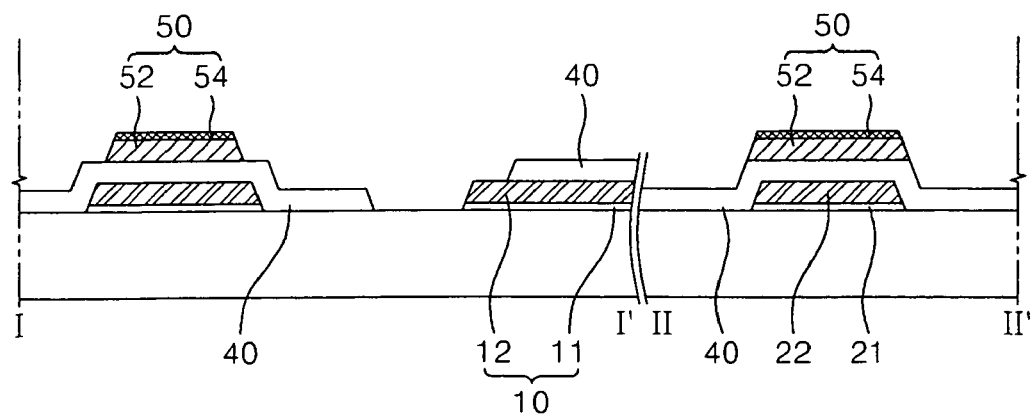

As shown in FIGS. 4A and 4B, a gate insulating material layer, a non-doped intrinsic amorphous silicon layer to which an impurity is not doped, and a doped amorphous silicon layer are sequentially deposited by using a plasma enhanced chemical vapor deposition ("PECVD") technique and then are sequentially etched, thereby forming the semiconductor pattern 50 and the gate insulating layer 40.

The second mask process is described below in more detail with reference to FIGS. 5A to 5F. FIGS. 5A to 5F are cross-sectional views illustrating detailed processes of the second mask process according to the exemplary embodiment of the present invention.

Figure 5A:
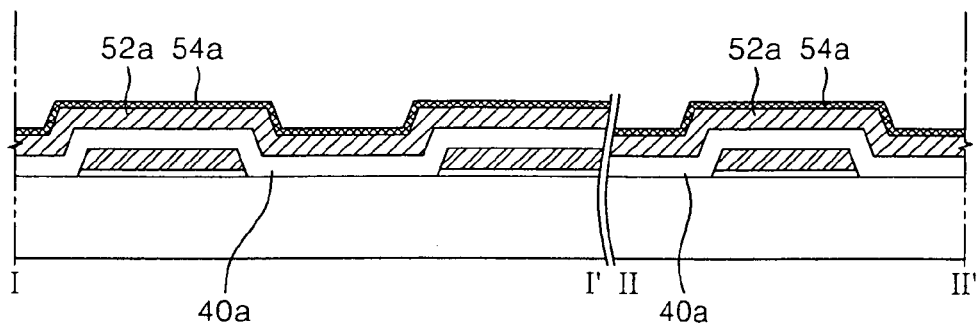
FIGS. 5A to 5F are cross-sectional views illustrating detailed processes of the second mask process according to the exemplary embodiment of the present invention.

Referring to FIG. 5A, the gate insulating material layer 40a, the non-doped intrinsic amorphous silicon layer 52a, and the doped amorphous silicon layer 54a are sequentially deposited by using the PECVD technique. The gate insulating material layer 40a is preferably made of SiNx, and a deposition temperature of the gate insulating material layer 40a is preferably a low temperature of about 240° C. to 280° C. in order to prevent a surface of the gate pattern from being damaged.

The gate insulating material layer 40a preferably has a thickness of from about 2,000 Å to about 5,000 Å in order to provide appropriate insulating characteristic. The gate insulating material layer 40a may be formed by using a deposition method that a lower portion of the gate pattern is not reduced instead of the low-temperature deposition method. Meanwhile, due to heat generated when the gate insulating material layer 40a is deposited, the amorphous ITO used as a material of the transparent conductive layer may be converted to poly ITO, improving transmittance of the pixel.

Figure 5B:
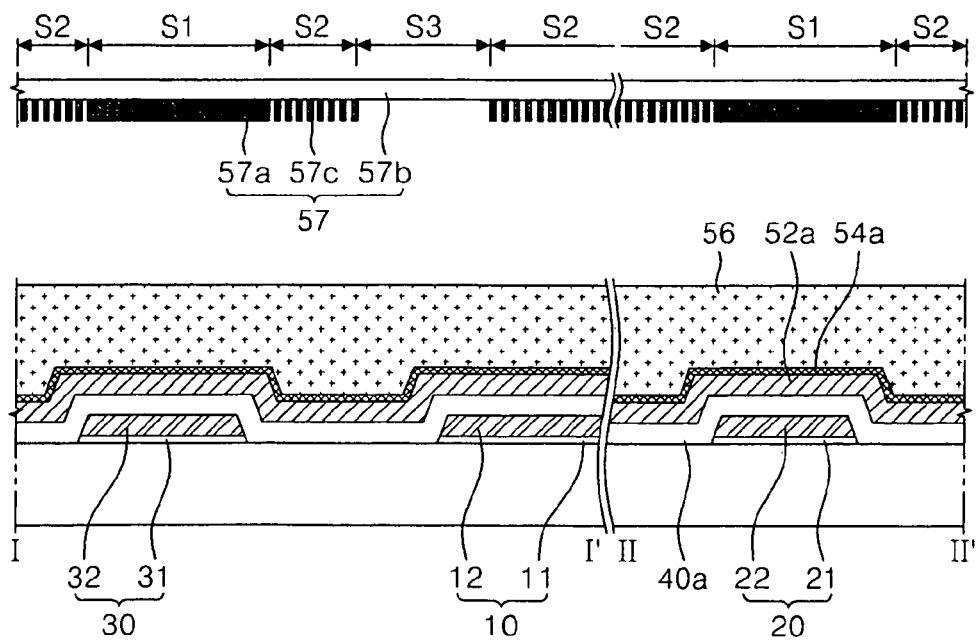

Referring to FIG. 5B, a photoresist layer 56 is coated on the doped amorphous silicon layer 54a at a thickness of about 1 μm or less. A second mask 57 is aligned above the substrate 1. The second mask 57 is a slit mask which is different from the first mask. The second mask 57 includes a shielding portion S1, a slit portion S2 and a transmitting portion S3 as shown in FIG. 5B.

The shielding portion S1 includes a shielding layer 57a for completely shielding light which is formed on a quartz substrate 57b. The shielding portion S1 is arranged corresponding to a region above the gate electrode 30 where both the semiconductor layer and the gate insulating material layer 40a are to remain and a region where the gate line 20 and the storage line 90 cross each other.

The slit portion S2 includes a plurality of slits 57c for partially transmitting light and partially shielding light which are arranged at a regular interval on the quartz substrate 57b. The slit portion S2 is arranged corresponding to a region above the gate line 20 where the semiconductor layer 50 is to be removed and the gate insulating material layer 40a is to remain, a region above the pixel electrode 10, and a region where the storage line 90 is to be formed.

The transmitting portion S3 is a portion where only the quartz substrate 57b exists to transmit light. The transmitting portion S3 is arranged corresponding to a region where the contact hole C is to be formed. That is, as shown in FIG. 5B, the transmitting portion S3 is arranged above only a very narrow region where the contact hole C is to be formed. That is, the transmitting portion S3 is arranged corresponding to a region where the drain electrode 80 and the pixel electrode 10 are to overlap, and it does not correspond to a region where the gate insulating layer 40 and the pixel electrode 10.

Figure 5C:
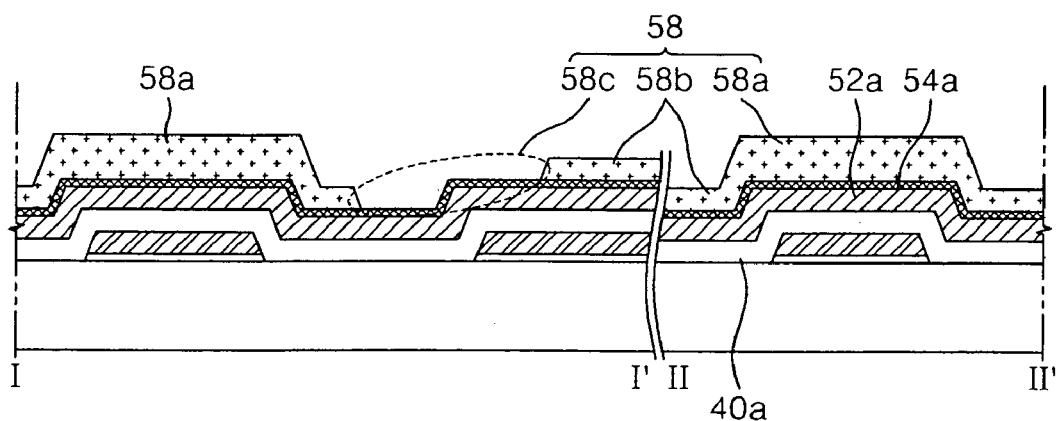

When the photoresist layer 56 is exposed to light and developed by using the second mask 57, a first photoresist pattern 58 which has different thickness according to a location is obtained as shown in FIG. 5C. The first photoresist pattern 58 includes an opening portion 58c, a thick layer portion 58a and a thin layer portion 58c as shown in FIG. 5C.

The opening portion 58c is a portion that a photoresist material is completely removed so that a layer below it is exposed. The opening portion 58c corresponds to a region where the contact hole C is to be formed. The thick layer portion 58a is a portion that an initially coated photoresist material remains "as is", and thus the thick layer portion 58a is thicker than portions 58b of the first photoresist pattern 58. The thick layer portion 58a corresponds to a region where the semiconductor pattern is to be formed as shown in FIG. 5C.

The thin layer portion 58b is a portion which has the thinner thickness than the thick layer portion 58a. The thin layer portion 58b corresponds to the slit portion of the second mask. That is, the thin layer portion 58b corresponds to remaining portions except portions corresponding to the opening portion 58c and the thick layer portion 58a. The thick layer portion 58b should endure a reaction of an etchant during an etching process of portions opened by the opening portion 58c.

Since the photoresist material is affected by the etchant, when the etching process is performed for a long time, it is preferable that the thin layer portion 58b has the relatively thick thickness. However, since the opening portion 58c corresponds to a region where the contact hole is to be formed, and thus it is very narrow, the etching process is performed for a short time. Therefore, the thickness of the thin layer portion 58b can be thinner than the conventional one. Preferably, the thickness of the thin layer portion 58b is about 3,000 Å to 4,000 Å. As described above, the thin layer portion 58b having the relatively thin thickness is desirable since it is easy to manage the photolithography process and a mass production is easy.

The thick layer portion 58a has a thickness of about 1.5 μm to 2.5 μm which is thicker than the thickness of the thin layer portion 58b.

Figure 5D:
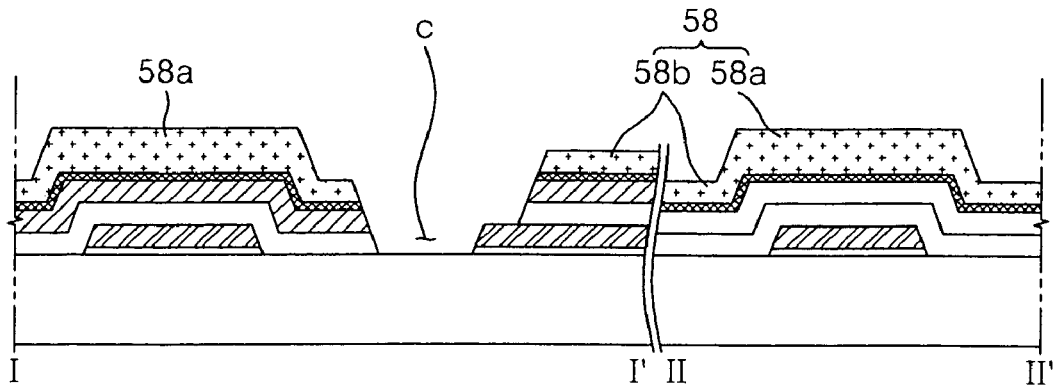

Subsequently, the doped amorphous silicon layer 54a, the intrinsic amorphous silicon layer 52a and the gate insulating material layer 40a are etched by using the first photoresist pattern 58. Therefore, the contact hole C having a shape shown in FIG. 5D is formed.

Figure 5E:
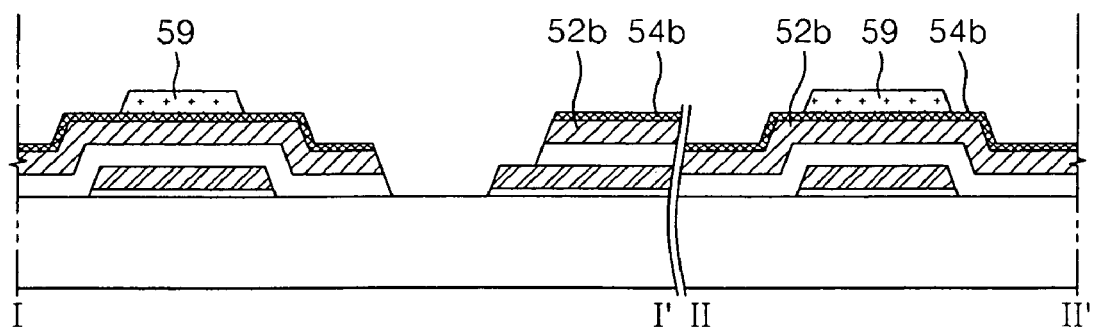

The ashing process is performed to remove the thin layer portion 58b of the first photoresist pattern 58 which reduces the thickness of the thick layer portion 58a, thereby forming a second photoresist pattern 59 as shown in FIG. 5E. The second photoresist pattern 59 exists corresponding to a region where the semiconductor pattern is to be formed as shown in FIG. 5E.

Figure 5F:
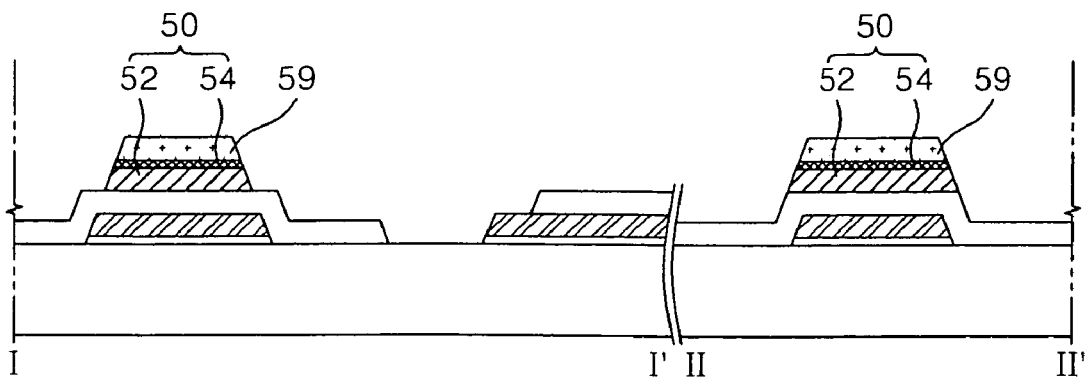

Portions of the doped amorphous silicon layer 54b and the intrinsic amorphous silicon layer 52b which are not covered by the second photoresist pattern 59 are sequentially etched by using the second photoresist pattern 59 as an etching mask to thereby form the semiconductor pattern 50 as shown in FIG. 5F. The ashing process is performed to remove the second photoresist pattern 59. According to the exemplary embodiment of the present invention, the etching process in the second mask process is simplified. Therefore, a mass production can be improved by reducing the thickness of the first and second resist patterns.

Figure 6A:
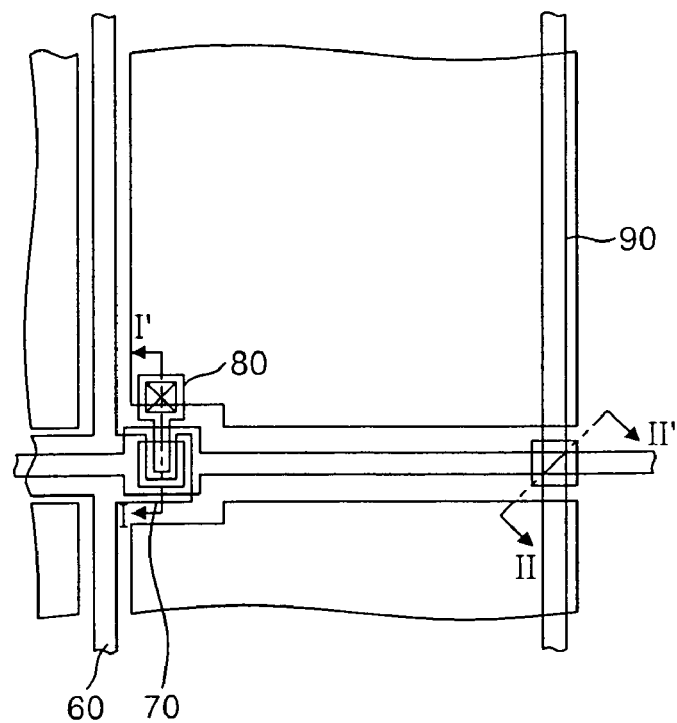
FIGS. 6A and 6B are respectively plan and a cross-sectional views taken along lines I-I' and II-II' of FIG. 6A illustrating a third mask process for manufacturing the TFT substrate according to the exemplary embodiment of the present invention.
Figure 6B:
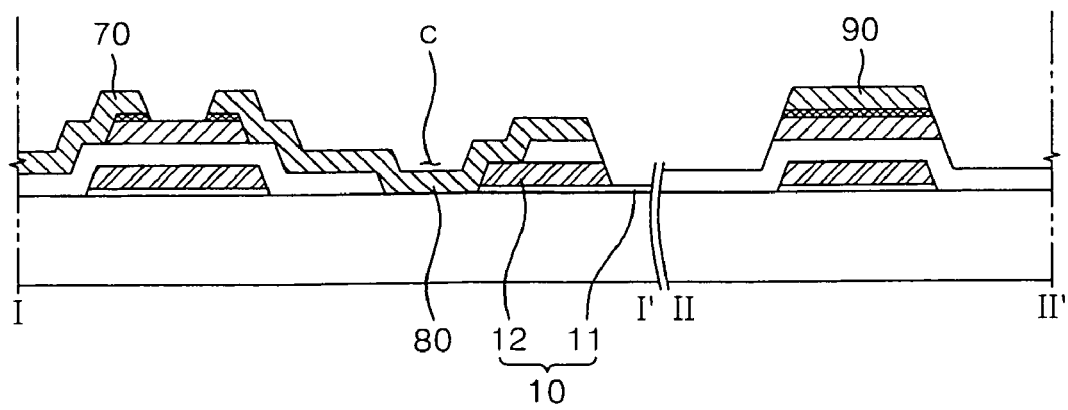

FIG. 6A is a plan view illustrating a third mask process for manufacturing the TFT substrate according to the exemplary embodiment of the present invention, and FIG. 6B is a cross-sectional view taken along lines I-I' and II-II' of FIG. 6A.

Referring to FIGS. 6A and 6B, a conductive material layer, for example, made of a metal is deposited by using, for example, the sputtering technique and is then patterned into a source/drain pattern having the source electrode 70, the drain electrode 80, the data line 60, and the storage line 90 through the photolithography process and the etching process using the third mask. In the third mask process, a portion of the opaque conductive layer 12 of the pixel electrode 10 except a portion of the opaque conductive layer 12 which overlaps the drain electrode 80 is also removed.

The third mask process is described below in more detail with reference to FIGS. 7A to 7F. FIGS. 7A to 7F are cross-sectional views illustrating detailed processes of the third mask process according to the exemplary embodiment of the present invention.

Figure 7A:
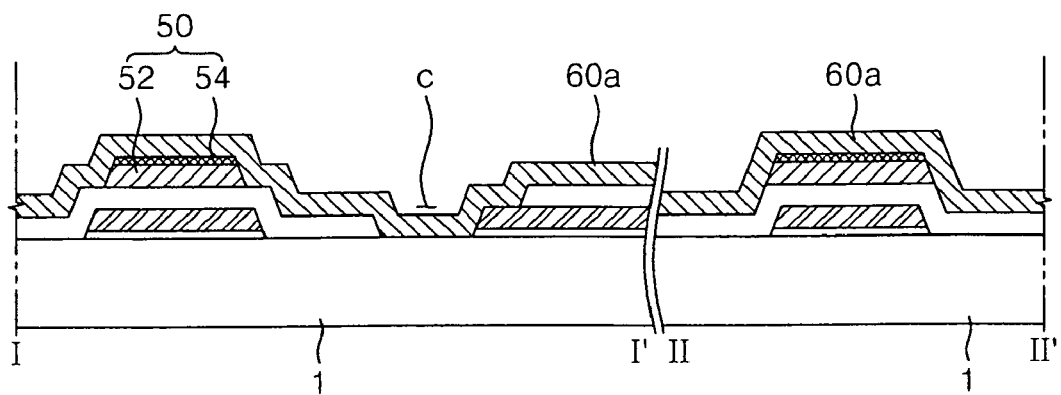
FIGS. 7A to 7F are cross-sectional views illustrating detailed processes of the third mask process according to the exemplary embodiment of the present invention.
Figure 7B:
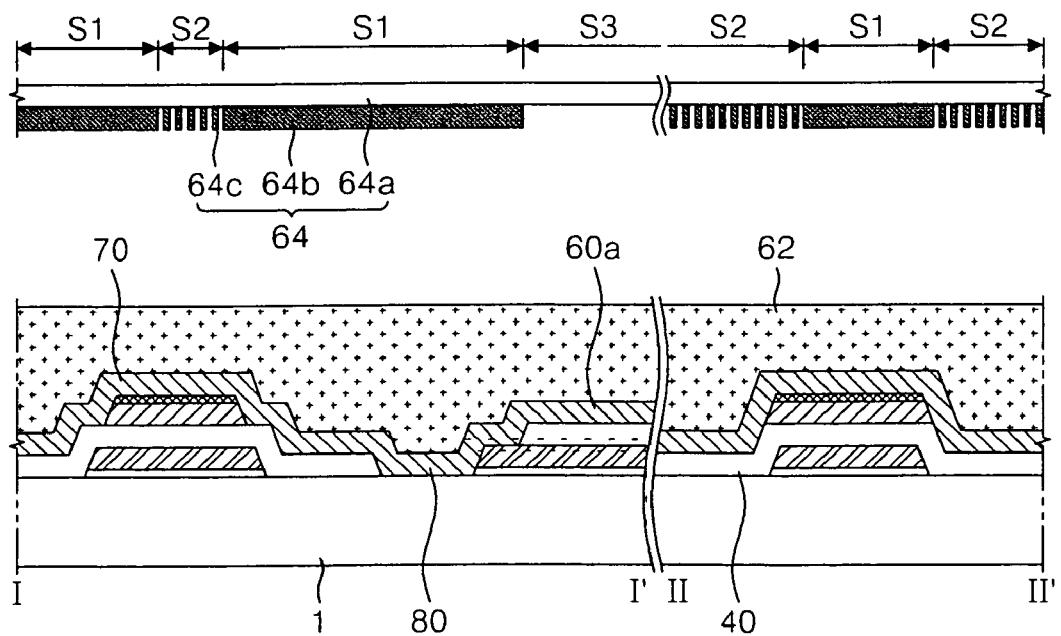

As shown in FIG. 7A, a conductive material layer 60a is formed on the substrate 1 having the contact hole C and the semiconductor pattern 50 by using, for example, the sputtering technique. Then, as shown in FIG. 7B, a photoresist layer 62 is coated over the whole surface of the substrate 1. The photoresist layer 6 has a thickness of about 1 μm to 2 μm.

As shown in FIG. 7B, a third mask 64 is aligned above the substrate 1 having the conductive material layer 60a and the photoresist layer 62, and then the light exposure process is performed. In this exemplary embodiment, a slit mask is used as the third mask 64. Therefore, similarly to the second mask 57, the third mask 64 includes a shielding portion S1, a slit portion S2 and a transmitting portion S3. A structure and functions of the shielding portion S1, the slit portion S2 and the transmitting portion S3 of the third mask 64 are identical to those of the second mask 57, and detailed descriptions are not required.

The shielding portion S1 of the third mask 64 corresponds to a region where the source and drain electrodes 80 are to be formed and a region where the data line 60 and the storage line 90 are to be formed. The slit portion S2 corresponds to a region between the source and drain electrodes 70 and 80 where a channel is to be formed and a region where only the gate insulating layer 40 exists. The transmitting portion S3 corresponds to remaining regions except regions corresponding to the shielding portion S1 and the slit portion S2.

Figure 7C:
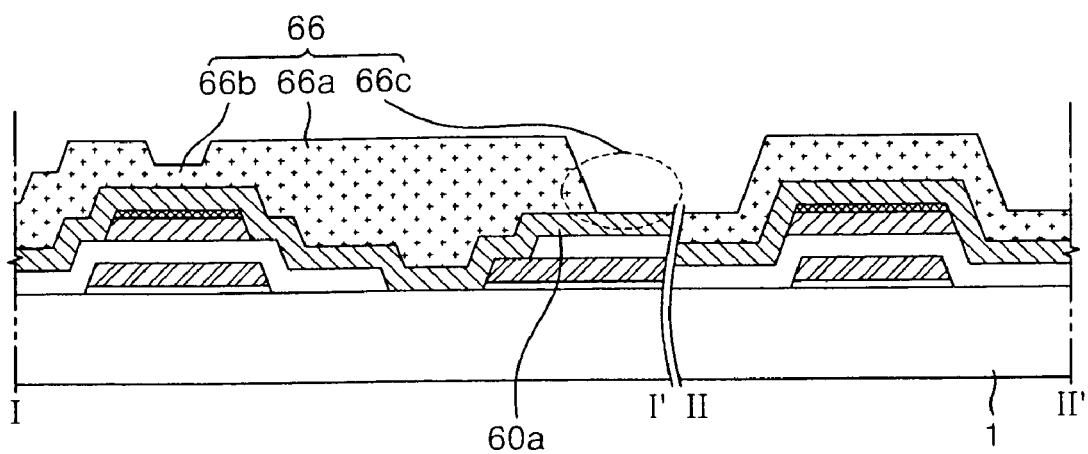
Figure 7D:
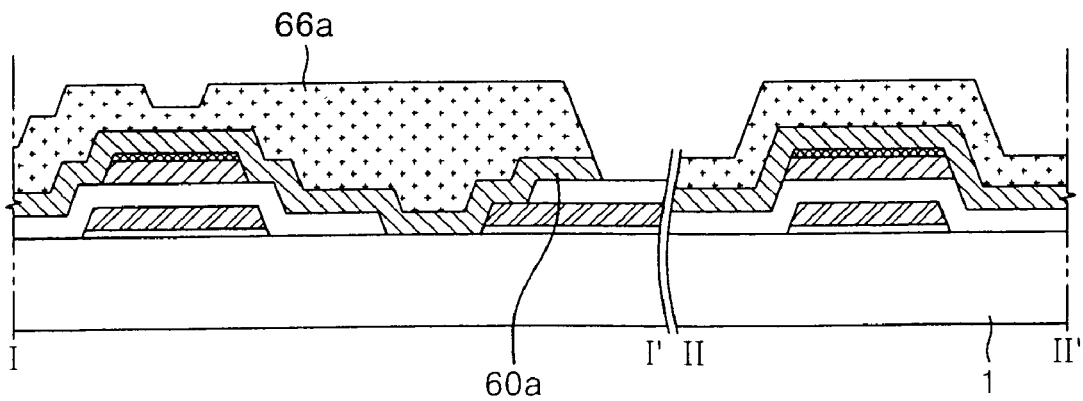
Figure 7E:
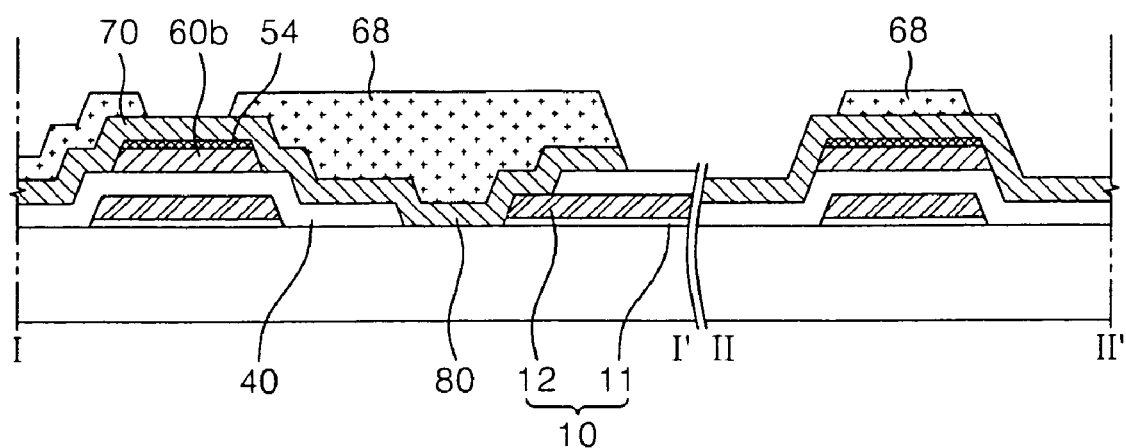

The photoresist layer 62 is exposed to light and developed by using the third mask 64 to thereby form a third photoresist pattern 66 as shown in FIG. 7C. The conductive material layer 60a is patterned by using the third photoresist pattern 66 as an etching mask to thereby remove the exposed portion of the conductive material layer 60a. Subsequently, the third photoresist pattern 66 is modified to form a fourth photoresist pattern 68 as shown in FIG. 7E. For example, a portion of the third photoresist pattern 66 is removed by using the ashing process to form the fourth photoresist pattern 68 having the relatively thin thickness. A region where a channel is to be formed is exposed by the fourth photoresist pattern 68.

A portion of the conductive material layer 60b corresponding to a region where a channel is to be formed is removed by using the fourth photoresist pattern 68 as the etching mask, thereby forming the source and drain electrodes 70 and 80. A portion of the doped amorphous silicon layer 54 between the source and drain electrodes 70 and 80 is removed by using the dry-etching technique. As a result, a channel is formed as shown in FIG. 7F.

Typically, the conductive material layer 60a is patterned by the wet-dry etching process which is the isotropic etching process, and thus the conductive material layer is further etched to the inside of the fourth photoresist pattern 68. In this state, the doped amorphous silicon layer 54 is patterned by using the fourth photoresist pattern "as is", and thus a portion of the doped amorphous silicon layer exposed outside the source and drain electrodes 70 and 80 remains by the dry-etching process which is the isotropic etching process. The n+ amorphous silicon portion exposed outside the source and drain electrodes 70 and 80 is called an n+ protruding portion which degrades characteristics of the TFT. Thus, it is preferable that the n+ protruding portion does not exist or is small.

Figure 7F:
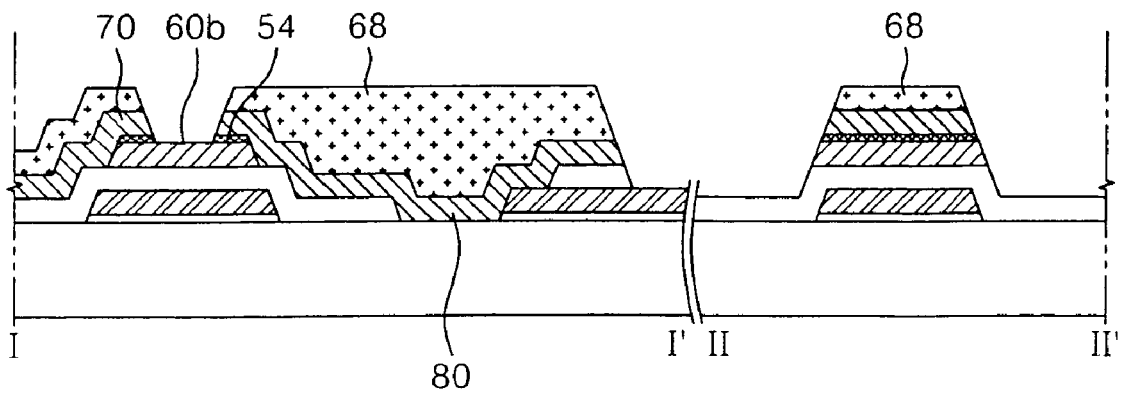

For this reason, after the portion of the conductive material layer 60b corresponding to a channel is removed by using the wet-dry etching technique as shown in FIG. 7E, the fourth photoresist pattern may be etched-back to align the source and drain electrode patterns with the fourth photoresist pattern 68 as shown in FIG. 7F. The exposed portion of the doped amorphous silicon layer is removed by using the modified fourth photoresist pattern 68 to thereby form the ohmic contact layer which has no n+ protruding portion.

Meanwhile, during the above process, a portion of the gate insulating layer 40 above the pixel electrode 10 is removed together. Therefore, the opaque conductive layer 12 of the pixel electrode 10 is exposed. Most of the opaque conductive layer 12 of the pixel electrode 10 is etched and thus removed, so that only the transparent conductive layer 11 remains in most region of the pixel electrode 10, and the opaque conductive layer 12 and the gate insulating layer 40 remain in only a region contacting the drain electrode 80.

Figure 8:
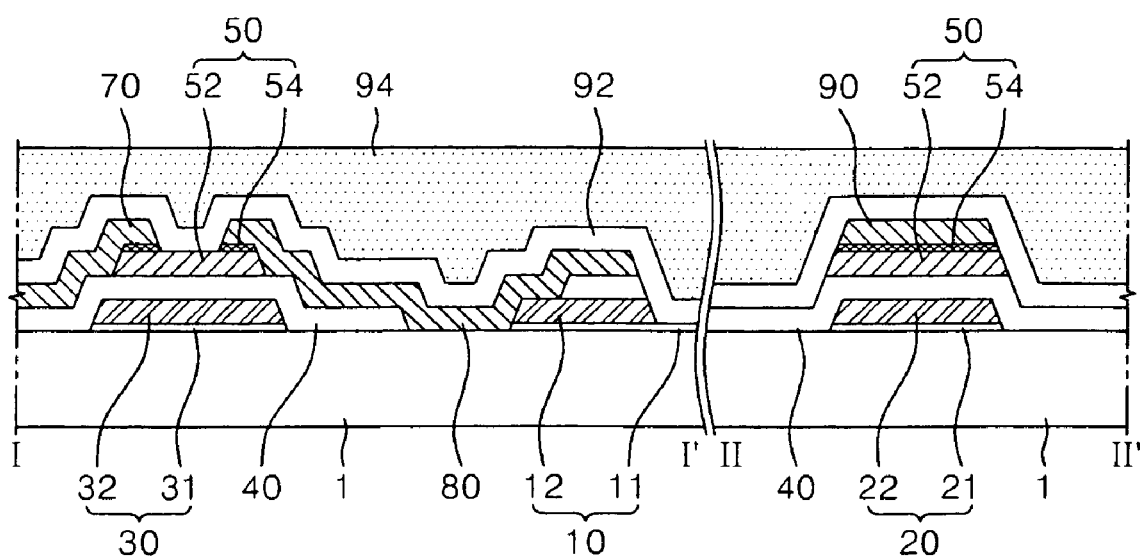
FIG. 8 is a cross-sectional view illustrating a process for forming a passivation film according to the exemplary embodiment of the present invention.

FIG. 8 is a cross-sectional view illustrating a process for forming the passivation film according to the exemplary embodiment of the present invention.

As shown in FIG. 8, the passivation film 92 is deposited over the whole surface of the substrate 1. The passivation film 92 may have a single layer structure having either an inorganic insulating layer or an organic insulating layer, or a dual layer structure having both an inorganic insulating layer and an organic insulating layer.

As described above, according to the present invention, the TFT substrate is manufactured by using the mask processes of three times, and the thickness of the photoresist of the second mask process can be thinner by distributing the etching process which has been concentrated on the second mask process to the third mask process. Thus, since the thickness of the photoresist is relatively thin, it is easy to obtain a processing margin, and a mass production is improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of manufacturing a thin film transistor (TFT) substrate, comprising:
   sequentially forming a transparent conductive layer and an opaque conductive layer on a substrate;
   patterning the transparent conductive layer and the opaque conductive layer using a first mask to form a gate pattern including a pixel electrode;
   forming a gate insulating layer and a semiconductor layer above the substrate;
   forming a contact hole which exposes a portion of the pixel electrode and a semiconductor pattern using a second mask;
   forming a conductive layer above the substrate; and
   patterning the conductive layer to form a source/drain pattern including a drain electrode which overlaps a portion of the pixel electrode, and removing portions of the gate insulating layer and the opaque conductive layer above the pixel electrode except a portion overlapping the drain electrode, by using a third mask,
   wherein the second mask is a slit mask, and
   wherein the forming the contact hole and the semiconductor pattern comprises:
      forming a first photoresist pattern on the semiconductor layer, the first photoresist pattern exposing a region where the contact hole is to be formed on the semiconductor layer;
      forming the contact hole using the first photoresist pattern;
      modifying the first photoresist pattern to form a second photoresist pattern which exposes a region except a region where the semiconductor pattern is to be formed;
      etching the semiconductor layer by using the second photoresist pattern to form the semiconductor pattern; and
      removing the second photoresist pattern.

2. The method of claim 1, wherein the transparent conductive layer is made of indium tin oxide (ITO), indium zinc oxide (IZO), tin oxide (TO), or indium tin zinc oxide (ITZO).

3. The method of claim 1, wherein forming the opaque conductive layer comprises:
   forming a lower layer made of a refractory metal which comprises molybdenum, chromium, tantalum, or titanium or of an alloy thereof on the transparent conductive layer;
   forming on the lower layer a middle layer made of a metal having a low specific resistance which comprises at least one of an aluminum-based metal, a silver-based metal, and a copper-based metal; and
   forming on the middle layer an upper layer made of a refractory metal which comprises molybdenum, chromium, tantalum, or titanium or of an alloy thereof.

4. The method of claim 1, wherein the first photoresist pattern comprises:
   an opening portion which exposes the region where the contact hole is to be formed;
   a first layer portion formed at a first thickness in the region where the semiconductor pattern is to be formed; and
   a second layer portion formed at a second thickness which is less than the first thickness in the remaining region except the regions corresponding to the opening portion and the first layer portion.

5. The method of claim 4, wherein the first thickness is about 1.5 to 2.5 μm or less.

6. The method of claim 4, wherein the second thickness is from about 3,000 to about 4,000.

7. The method of claim 1, wherein the semiconductor pattern has an area smaller than an area of the gate electrode.

8. The method of claim 1, wherein the conductive layer is made of a refractory metal which comprises molybdenum, chromium, tantalum, or titanium or of an alloy thereof.

9. The method of claim 1, wherein the third mask is a slit mask.

10. The method of claim 1, wherein the step of forming the source/drain pattern and removing the gate insulating layer and the opaque conductive layer above the pixel electrode by using the third mask comprises:
   forming a third photoresist pattern which exposes the remaining region except a portion of the pixel electrode corresponding to the contact hole on the conductive layer;
   removing portions of the conductive layer and the gate insulating layer except the portion of the pixel electrode corresponding to the contact hole by using the third photoresist pattern;
   modifying the third photoresist pattern to form a fourth photoresist pattern which exposes a channel region between the source and drain electrodes;
   removing a portion of the conductive layer corresponding to the channel region and a portion of the opaque conductive layer above the pixel electrode except a portion overlapping the conductive layer by using the fourth photoresist pattern; and
   removing the fourth photoresist pattern.

11. The method of claim 1, wherein the step for forming the source/drain pattern and removing the gate insulating layer and the opaque conductive layer above the pixel electrode by using the third mask comprises:
   forming a third photoresist pattern which exposes the remaining region except a portion of the pixel electrode corresponding to the contact hole on the conductive layer;
   removing portions of the conductive layer, the gate insulating layer and the opaque conductive layer above the portion of the pixel electrode except portions corresponding to the contact hole by using the third photoresist pattern;

modifying the third photoresist pattern to form a fourth photoresist pattern which exposes a channel region between the source and drain electrodes;

removing a portion of the conductive layer corresponding to the channel region by using the fourth photoresist pattern; and removing the fourth photoresist pattern.

* * * * *